(12) United States Patent
Mikhael et al.

(10) Patent No.: US 7,005,161 B2
(45) Date of Patent: *Feb. 28, 2006

(54) VAPOR DEPOSITION OF SOLID OLIGOMERS

(75) Inventors: Michael G. Mikhael, Tucson, AZ (US); Angelo Yializis, Tucson, AZ (US)

(73) Assignee: Sigma Laboratories of Arizona, Inc., Tucson, AZ (US)

( * ) Notice: Subject to any disclaimer, the term of this patent is extended or adjusted under 35 U.S.C. 154(b) by 167 days.

This patent is subject to a terminal disclaimer.

(21) Appl. No.: 10/475,923

(22) PCT Filed: Jun. 22, 2001

(86) PCT No.: PCT/US01/19849

§ 371 (c)(1),
(2), (4) Date: Oct. 24, 2003

(87) PCT Pub. No.: WO03/000949

PCT Pub. Date: Jan. 3, 2003

(65) Prior Publication Data

US 2005/0126492 A1   Jun. 16, 2005

Related U.S. Application Data

(63) Continuation-in-part of application No. 09/346,877, filed on Jul. 2, 1999, now Pat. No. 6,270,841.

(51) Int. Cl.
*C23C 14/24* (2006.01)

(52) U.S. Cl. ............ 427/255.6; 427/294; 427/398.1; 427/398.2; 425/378.1; 118/715; 118/730

(58) Field of Classification Search ............ 427/255.6, 427/294, 398.1, 398.2; 118/715, 729, 730; 425/378.1

See application file for complete search history.

(56) References Cited

U.S. PATENT DOCUMENTS

| 3,123,655 A | * | 3/1964 | Otting et al. ........... 264/211.21 |
| 3,686,022 A | | 8/1972 | White et al. ............. 117/93.31 |
| 4,705,720 A | | 11/1987 | Kundinger et al. ......... 428/332 |
| 5,681,615 A | | 10/1997 | Affinito et al. ........... 427/255.6 |
| 5,902,641 A | | 5/1999 | Affinito et al. ........... 427/255.2 |
| 5,945,174 A | | 8/1999 | Shaw et al. ................. 427/509 |
| 6,086,952 A | | 7/2000 | Lang et al. ............. 427/255.29 |

OTHER PUBLICATIONS

E. Rebourt et al., "Polyanaline Oligomers; Synthesis and Characterization," Synthetic Metals 84 (1997) 65-66.
K. Matyjaszewski et al., "Synthesis of Well-Defined Polyacrylonitrile by Atom Transfer Radical Polynerization," Macromolecules, vol. 30, No. 20, 1997.

* cited by examiner

Primary Examiner—Fred Teskin
(74) Attorney, Agent, or Firm—Antonio R. Durando; Quarles & Brady Streich Lang LLP

(57) ABSTRACT

A monomer is selected to produce a polymeric film having desirable characteristics for a particular application. The monomer is ppolymerized under controlled conditions to produce a solid oligomer having those characteristics at a molecular weight suitable for evaporation under vacuum at a temperature lower than its thermal decomposition temperature. The process of polymerization to produce the oligomer is carried out under conditions that yield a finite molecular-chain length with no residual reactive groups. The solid oligomer so produced is extruded as a film onto a revolving drum (38) in the evaporation section (40) of a vapor deposition chamber, and then cryocondensed on a cold substrate (44) to form a solid film having the same characteristic selected in the solid oligomer constituting the starting material. As a result of the initial complete reaction to produce the oligomer, the thin-film product does not contain unreacted groups and all attendant disadvantages are avoided.

6 Claims, 4 Drawing Sheets

VAPOR DEPOSITION OF SOLID OLIGOMERS

RELATED APPLICATIONS

This is a continuation-in-part application of U.S. Ser. No. 09/346,877, filed Jul. 2, 1999 U.S. Pat. No. 6,270,841.

BACKGROUND OF THE INVENTION

1. Field of the Invention

This invention is related in general to a process of manufacture of thin polymer films by vacuum vapor deposition. In particular, it pertains to, the vacuum evaporation and deposition of solid oligomers to form a solid film on a substrate directly without, subsequent polymerization or curing reaction.

2. Description of the Related Art

Thin metallic and polymeric films are used on various substrates, such as paper, fabrics, plastic and metal foils, to add or promote desirable properties for particular applications. For example, foils used to preserve food need to have very low permeability to oxygen; the exterior surface of packaging material has to be capable of accepting inks for printing purposes; and packaging materials for electronic products also require a limited amount of conductivity to dissipate electrostatic charges. Similarly, metallic pigment flakes are produced by depositing a thin layer of metal on a web from which the metal is later separated and crushed; therefore, it is important that the web material be suitable for the separation step. To these ends, it is desirable and sometimes necessary to modify the physical properties of polymeric films to improve their suitability for the intended purpose. Preferably, though, the films are directly formed with a composition and molecular structure characterized by the desired properties.

Thin films of metals and polymers are created by deposition onto appropriate substrates by a variety of known processes, most notably through film formation by wet chemistry or vapor deposition. Chemical processes produce soluble thermoplastic as well as insoluble thermoset polymers and involve the use of solvents; thus, film formation is achieved through solvent diffusion and evaporation. As a result, these processes require relatively long residence times and the undesirable step of handling solvents.

Vapor deposition processes involve the evaporation of a liquid monomer in a vacuum chamber, its deposition on a cold substrate (referred to in the art as "cryocondensation"), and the subsequent polymerization by exposure to electron beam or ultraviolet radiation. As illustrated schematically in FIG. 1, the liquid monomer from a supply reservoir 12 is fed through a capillary tube 14 and an atomizer 16 into the heated evaporator section 18 of a vacuum deposition chamber 10 where it flash vaporizes under vacuum. The resulting monomer vapor is then passed into a condensation section 20 of the unit where it condenses and forms a thin liquid film upon contact with the cold surface of an appropriate substrate, typically a rotating drum 22. A metal vaporization unit 24 may also be used to deposit in line a thin metal layer on the drum 22 for multilayer deposition. The liquid deposited film is then cured by exposure to an electron beam or ultraviolet radiation source 26. Since the ultimate objective is the formation of solid films, the initial liquid monomer must be capable of polymerization and contain enough reactive groups to ensure that a sufficiently large polymeric molecule results and yields a solid product.

This conventional approach of utilizing a polymerizable monomer as the raw material for thin-film forming processes has been followed over the years because it is not possible to vaporize the final polymeric product under the range of operating conditions of a commercially viable vapor deposition chamber (typically, $10^{-3}$ to $10^{-6}$ torr and 70° C.–350° C.). Thus, the practice in the industry has been to identify or develop polymers having specific characteristics deemed advantageous for a particular film application. A solid thin film of the polymer is then formed on a target substrate by evaporating the corresponding liquid monomer, cryocondensing it as a monomer in liquid form and polymerizing or cross-linking it to reach the required molecular weight to ensure its solidification. Many variations of this basic approach have been developed for particular applications, but all prior-art vacuum deposition processes involve the formation of a solid film by polymerization of a liquid monomer evaporated under vacuum or atmospheric conditions and recondensed on a cold surface to obtain the desired film characteristics.

This approach has several inherent constraints that often produce disadvantages. Most importantly, the selected monomers have to include reactive moieties, such as acrylate and vinyl groups, in order to enable polymerization and produce a solid, usable film after condensation. Thus, the resulting polymeric film necessarily contains reactive groups that give the film reactive characteristics that may be undesirable for particular uses. For example, the oxygen atoms in acrylate groups gives the film adhesion properties that prevent it from being used as a release coating.

Because thin-film forming by vapor deposition is commercially preferable, considerable research has been conducted to develop processes for improving the properties of thin films obtained by polymerization of vacuum deposited monomers. For example, U.S. Pat. No. 5,681,615 discloses a method for incorporating a salt of desirable characteristics into the polymeric film. The salt is dissolved in the initial liquid monomer, which is then vaporized at a temperature below the decomposition and polymerization temperatures of the composite material and cryocondensed according to conventional practice.

In U.S. Pat. No. 5,902,641, a further improvement is introduced by vaporizing a two-phase mixture of a liquid monomer and insoluble solid particles, thereby producing a homogeneous vapor mixture of the two components. The mixture is then cryocondensed and the monomer is polymerized or cross-linked according to standard procedures to yield a thin film that contains the solid component in uniform, homogeneous distribution. Thus, the process enables the manufacture, for example, of doped polymeric films for the electronic industry.

The main drawback of all prior-art vapor-deposition techniques is the fact that they require polymerization or cross-linking of the liquid-film monomer formed by vacuum evaporation and cryocondensation. Thus, the presence of residual reactive groups in the final product is unavoidable.

Therefore, there is still a need for an approach to thin-film polymer manufacture that makes it possible to produce films without the inherent disadvantages that result from polymerization and/or cross-linking. This invention is directed to a process for achieving this objective by judiciously selecting appropriate oligomers as the starting material for the manufacture of thin films.

BRIEF SUMMARY OF THE INVENTION

One primary objective of this invention is a method for producing polymeric thin coatings that do not contain undesirable reactive groups in a solvent-free, environmentally safe process.

Another important objective is a process that produces a thermoplastic, soluble and/or fusible, and possibly recyclable coating.

Another objective is a process that can be implemented at a high production rate by deposition on a continuous web.

Still another objective is a process that can be implemented to coat large surface areas.

Another goal is a process that produces a highly uniform, defect-free thin film.

Another objective is a process that makes it possible to select the properties of the vapor-deposition raw material to tailor the desired properties of the thin-film product.

Specifically, a goal of the invention is a process for manufacturing thin films suitable as release coatings.

Another specific goal is a process for manufacturing thin films suitable for packaging of food and electronic products.

Another objective is a procedure that can be implemented utilizing modified prior-art vapor deposition technology.

Still another goal of the invention is an apparatus suitable for carrying out a process for producing polymeric thin films that do not contain undesirable reactive groups.

Similarly, a specific objective is an apparatus for manufacturing thin films that are suitable as release coatings.

Another goal of the invention is a device for introducing a solid feed into a vapor-deposition chamber such that it can be flash evaporated at controlled feed rates under conventional temperature and pressure conditions.

A final objective is a procedure that can be implemented easily and economically according to the above stated criteria.

Therefore, according to these and other objectives, the present invention consists of selecting a monomer that is known to produce a polymeric film having desirable characteristics for a particular application. The monomer is polymerized under controlled conditions to produce a solid oligomer having those characteristics at a molecular weight suitable for evaporation under vacuum at a temperature lower than its thermal decomposition temperature. The process of polymerization to produce the oligomer is carried out under conditions that yield a finite molecular-chain length with no residual reactive groups. The solid oligomer so produced is liquefied and extruded as a film onto a revolving drum in the evaporation section of a conventional vapor deposition chamber, and it is then cryocondensed on a cold substrate to form a solid thin film having the same desirable characteristic selected in the solid oligomer constituting the starting material. As a result of the initial complete reaction to produce the oligomer, the thin-film product does not contain unreacted groups and all attendant disadvantages are avoided.

According to another aspect, the invention relates to a modified extruder, feed nozzle and rotating hot drum for heating and vaporizing a solid oligomer under vacuum conditions. The oligomer is preferably granulated and fed into the extruder wherein the solid particles are heated and gradually melted as they advance toward the extruder's outlet. The nozzle shapes the liquified material into a thin film that is deposited on the revolving hot drum in a conventional vacuum evaporator, whereby the liquid film flashes into a homogeneous vapor that is subsequently cryocondensed to form a thin film of the same molecular eight of the starting material.

Various other purposes and advantages of the invention will become clear from its description in the specification that follows and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose but one of the various ways in which the invention may be practiced.

DESCRIPTION OF THE PREFERRED EMBODIMENTS OF THE INVENTION

Figure 1:
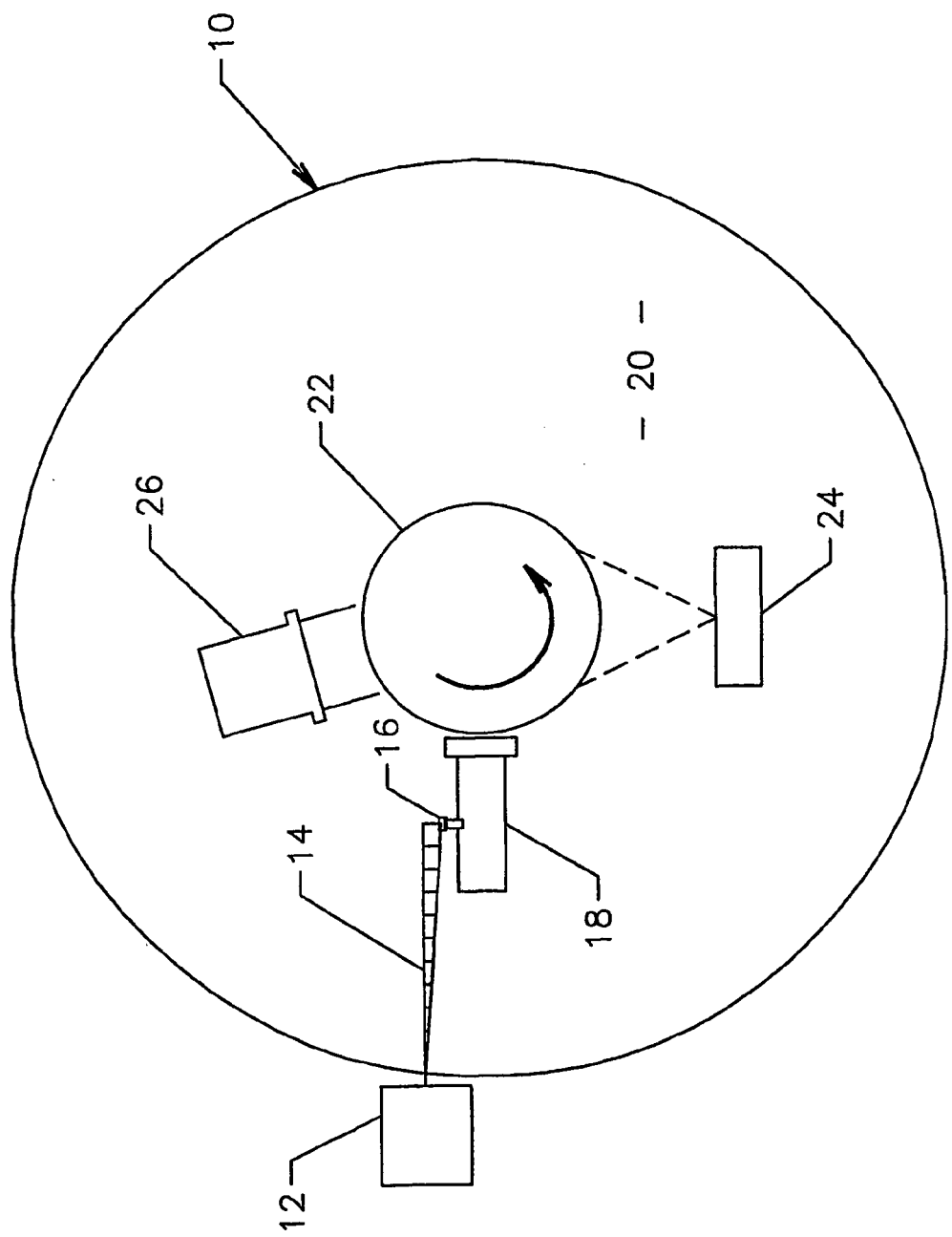
FIG. 1 is a schematic representation of a prior-art vacuum vapor deposition and radiation curing unit.

One aspect of the present invention lies in the recognition that oligomers and polymers derived from a given monomer often have the same physical and chemical characteristics and that, therefore, they can be used interchangeably in the manufacture of thin-film coatings. Based on this initial realization, the heart of the invention lies in the idea of evaporating a solid oligomer selected to have a vaporization temperature below its thermal decomposition temperature under the vacuum conditions attainable with conventional vapor deposition equipment. Thus, the resulting vapor can be cryocondensed directly into a solid thin film characterized by the same properties of interest without the need for further polymerization, as required in all prior-art techniques.

As used herein, the term oligomer is intended to refer not only to molecular chains normally designated as such in the art (typically containing between two and ten monomer molecules) but also to low-molecular weight polymers; specifically, oligomer is meant to encompass any polymerized molecule having a molecular weight sufficiently low to permit its vaporization under vacuum at a temperature lower than its temperature of thermal decomposition. With current vacuum technology, such maximum molecular weight is approximately 5,000, the precise molecular weight depending on the specific monomer used, but it is understood that greater molecular weights would become available for inclusion in the practice of the invention if greater vacuum conditions were obtained. Therefore, the invention is not to be limited to polymeric chains with molecular weight less than about 5,000, but is intended to include any polymeric molecule, herein defined as oligomeric, that is solid at the temperature and pressure of its intended use and is capable of vaporization at a temperature lower than the temperature at which it decomposes or otherwise degrades. Thus, the term oligomer alone, as here defined, is used for convenience to describe the invention.

A solid oligomer for the purposes of the invention is defined as a low molecular-weight polymeric composition that is solid at the temperature and pressure conditions of its intended use. As well understood in the art, the term cryocondensation refers to a phase-change process from gas to liquid obtained upon contact with a surface having a temperature lower than the dew point of the gas at a given operating pressure. The term thin film is intended to encompass any layer of material with a thickness in the order of microns, the thickness typically consisting of polymeric films produced either by vapor deposition or by wet-chemistry processes. Finally, the term degradation is used interchangeably with the term decomposition.

One aspect of the invention involves the polymerization of a selected monomer under controlled conditions to produce a solid oligomer having the properties targeted for the thin-film product to be manufactured by vapor deposition. The oligomer is selectively produced with a molecular weight sufficient to provide the desired film characteristics as a solid at the temperature of application. In addition, the oligomer must have a vaporization temperature that is below its decomposition temperature at the operating pressures of conventional vapor deposition chambers ($10^{-3}$ to $10^{-6}$ torr), and that is also within the temperature operating range of such equipment (70° C.–350° C.). The oligomer so produced is separated from unreacted monomer molecules to eliminate substantially all reactive groups from the raw material used to form the target thin film, as intended in order to obtain an unreactive product.

Figure 2:
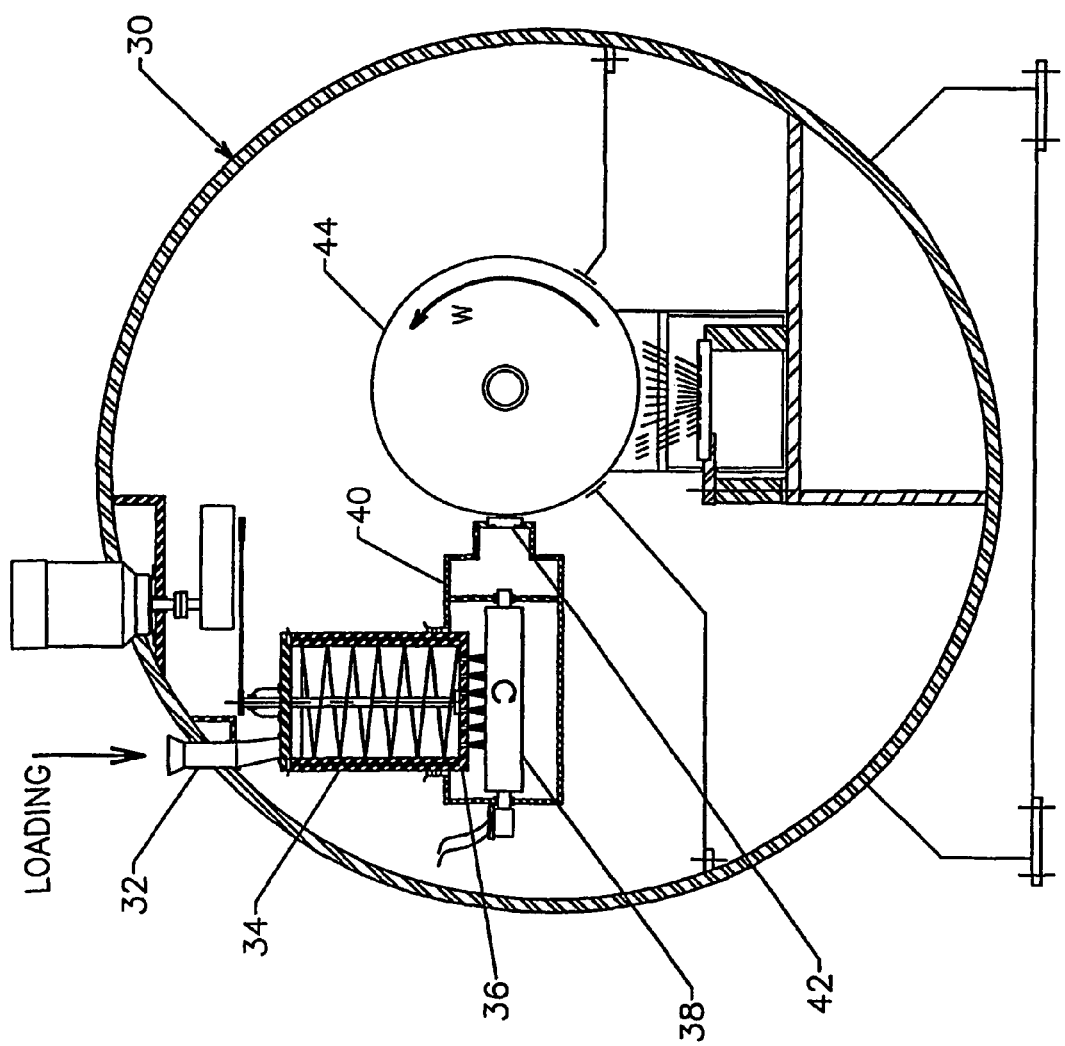
FIG. 2 is a schematic representation of a modified vacuum vapor deposition unit according to the invention.
Figure 3:
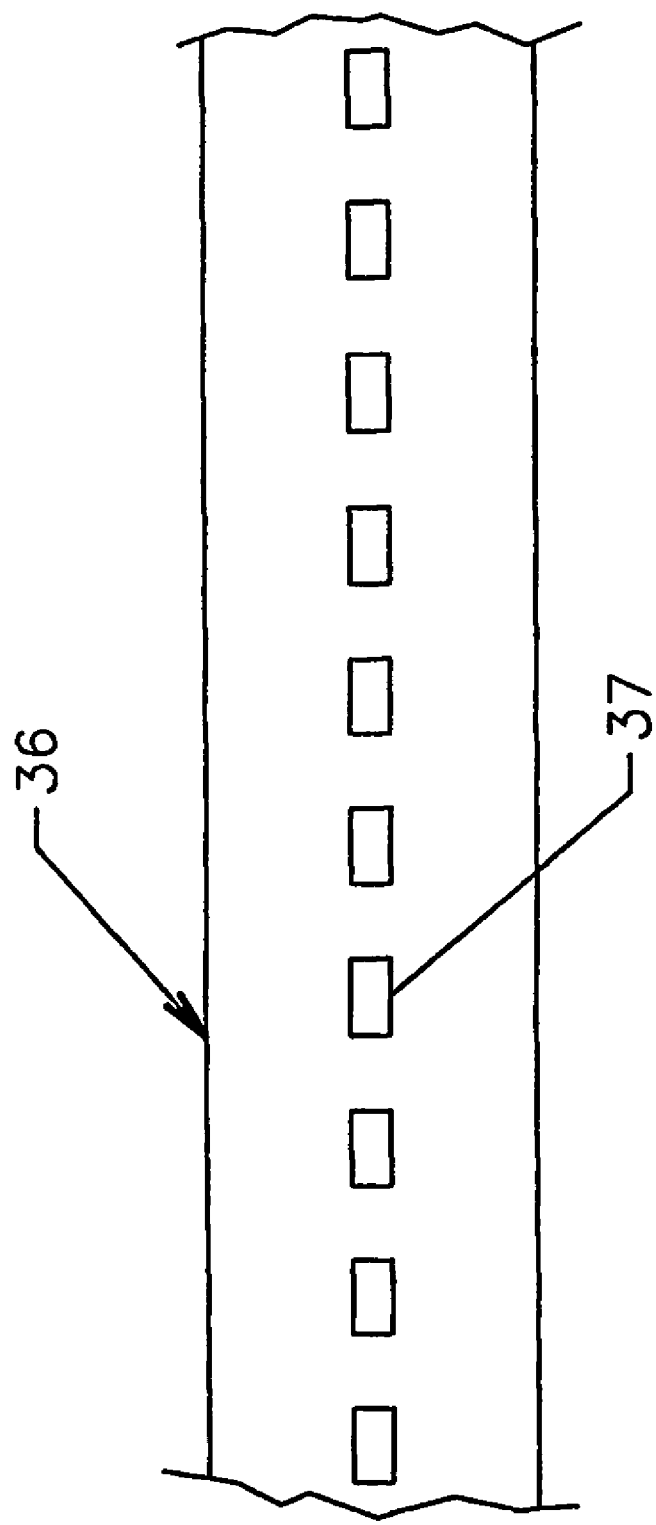
FIG. 3 is a partial schematic representation of the front portion of the nozzle of the invention.

According to another aspect of the invention, the oligomer material is granulated or otherwise reduced to particles and fed into a hopper for processing in a modified conventional vacuum vapor deposition unit 30, as illustrated schematically in FIG. 2. The solid oligomer particles are fed from the hopper 32 into a heated extruder 34 that liquefies the material and forces it out of a nozzle 36 as a plurality of thin liquid film strips suitable for flash evaporation. As illustrated in FIG. 3, each slit opening 37 in the nozzle 36 is about 1–2 mm wide and 4–5 mm long. The nozzle 36 extrudes the liquid film continuously onto a heated rotating drum 38 under vacuum which causes its evaporation upon contact. This novel assembly of parts constitutes the evaporator of the vapor deposition unit 40 of the invention.

The resulting vaporized oligomeric molecule is then passed through a slit 42 to reach the cryocondensation section in the vapor deposition unit. Upon contact with a rotating cold drum 44 (typically kept at −20° C. to 30° C.), the vapor condenses and forms a uniform, homogeneous thin film that quickly solidifies into the final product. As in prior-art vapor deposition units, the thin film may be deposited over the drum 44 to produce a multilayer product or over a web substrate in contact with the drum to produce a continuous film coating. No further polymerization is required to solidify the film. A metal vaporization unit 46 may be used to add a metallic layer to the deposited thin film.

In order to ensure the uniform deposition of the vaporized oligomer over the condensation drum 44, it is critical that the feed rate of oligomer to the evaporator be controlled precisely. The use of an extruder, which can be run at a well defined and controlled extrusion rate, was found to be ideal for feeding the hot drum in the evaporator section of the vapor deposition unit of the invention. At the same time, the use of a slit nozzle that produces a very thin liquid film of oligomer makes it possible to approximate the very large surface area created by atomization, thereby enabling the immediate vaporization of the liquid oligomer upon contact with a hot surface. It is noted that vaporization of the liquified oligomer by regulating its flow through a solenoid valve and passing it through an atomizer, as done in the prior art, would not afford the degree of feed control required for the process of the invention because oligomers are too viscous. Thus, the use of an extruder is ideal for this application.

Figure 4:
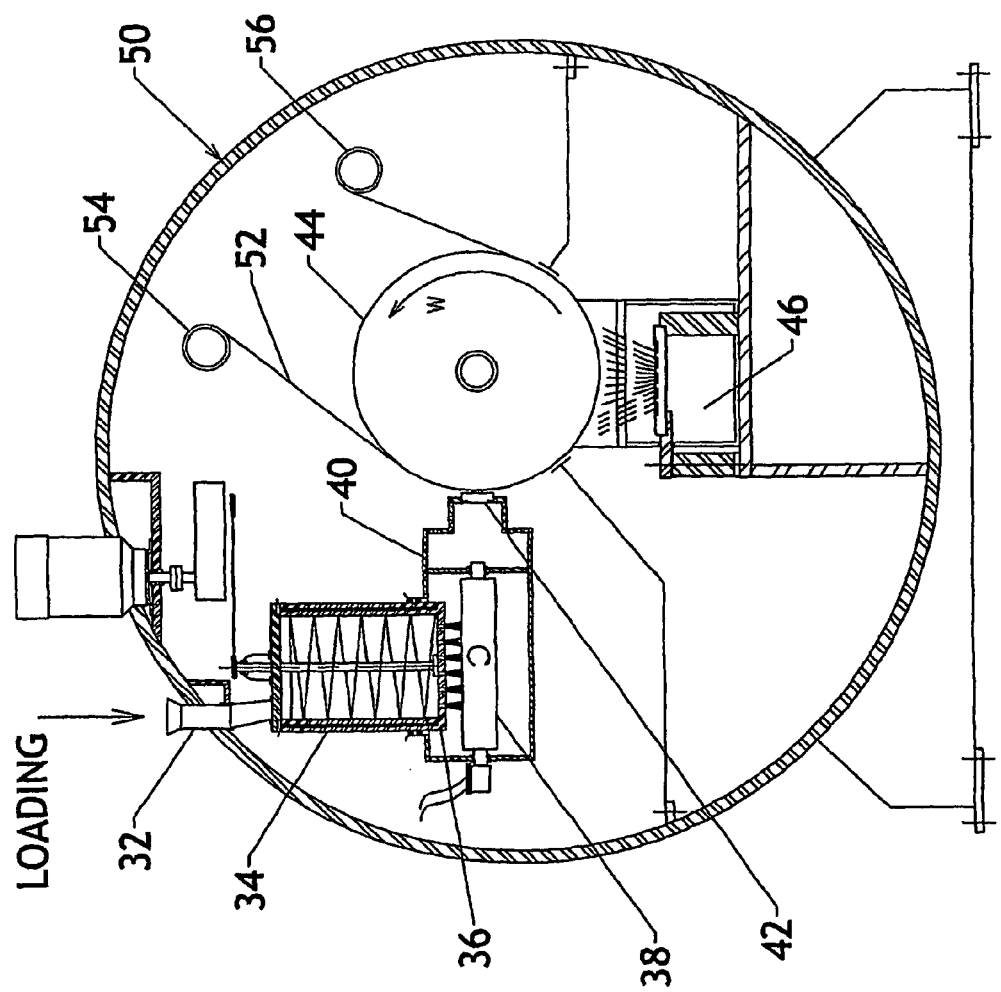
FIG. 4 is a schematic representation of a continuous-feed vapor deposition unit according to the invention.

A flash-evaporation chamber 50 suitable for continuous deposition over a moving web is illustrated schematically in FIG. 4. The unit is substantially as described in FIGS. 2 and 3, but the oligomer vapor is condensed and forms a thin liquid film upon contact with the cold surface of a continuous web 52, which in turn is contacted by the cold rotating drum 44 as it progresses from a feed roll 54 to a take-up roll 56. A duplicate coating system (not shown) with a corresponding oligomer supply reservoir, extruder and nozzle (or a conventional monomer deposition system) may be utilized in series to apply an additional coating over the web substrate 52 in a single pass. Still additional coating units could be employed serially to manufacture multiple-layer composites. Similarly, one or more metal vaporization units 46 may be used to deposit thin metal layers, such as needed to produce an electrode film.

The following examples illustrate the invention.

EXAMPLE 1

This example illustrates the manufacture of a solvent-free, flash evaporated and vacuum deposited thermoplastic (soluble and fusible) release coating. The object is the preparation of a release coating usable for the manufacture of metal flakes utilized in pigment production. According to the prior art, the metal flakes are produced by depositing a metal film over a polymeric substrate coated with a polymeric film, and then by separating the metal film from the substrate and crushing it to yield flakes. Existing technology is based on relatively low-rate solvent-based processes for releasing the metal film from the polymeric substrate.

The materials selected for this application of the invention are hydrocarbon polymers (e.g., polyethylene and polystyrene) which are known to exhibit very poor adhesion to substrate films and to other top coatings (metal, ceramic). The metal flakes are produced by depositing a metal film over an oligomeric release coating formed by vapor deposition over a substrate according to the invention. The release process can be mechanical peel off, melting of the release coating, or dissolving of the release coating.

First Run: A polyethylene oligomer of molecular weight 4000, available from Aldrich Chemicals Company of Milwaukee, Wis., was melted at 130° C. and extruded into a $10^{-5}$- to $10^{-6}$ torr vacuum chamber to be spread on a hot rotating drum (at about 300° C.) and evaporated (see FIG. 2). The formed vapor, driven by vacuum, was passed through a slit nozzle from the evaporating area to a deposition chamber and deposited as a solid coating (0.5 to 1.0 micron thick) on a cold polyester web (in intimate contact with a drum kept at about 0° C.). Aluminum film was deposited in-line on top of the polyethylene-oligomer release coating according to conventional vapor deposition. The web was running at 200 ft/min. Aluminum metal flakes were released from the substrate film by crushing it, and then either melting (at about 100° C.) or dissolving (in toluene) the release layer.

Second Run: A poly(α-methylstyrene) oligomer of molecular weight 1300, available from Aldrich Chemicals, was melted at 150° C. and extruded into a $10^{-5}$–$10^{-6}$ torr vacuum chamber to be spread on a hot rotating drum (at about 300° C.) and evaporated. The formed vapor, driven by vacuum, was deposited as a solid coating (0.3 to 0.8 micron thick) on a cold polyester web (at about 0° C.). An aluminum film was deposited in-line on top of the polyethylene-oligomer release coating. The web was running at 200 ft/min. The metal flakes were released from the substrate film by crushing, and then melting (at about 100° C.) or dissolving (in toluene) the release layer. Similar products were produced successfully with poly(α-methylstyrene) oligomers of molecular weight up to 2000.

EXAMPLE 2

This example illustrates the manufacture of multilayer strap release layers (existing technology consists of crosslinked insoluble and infusible release layers). The object is again the preparation of a release coating usable for the manufacture of metal flakes utilized in pigment production.

A multilayer sequential metal-release coating strap can be produced by the technique of the invention. The thin metal layers can be released and crushed to pigments by melting or dissolving the thermoplastic release layers which separate the metal layers.

Run 1: A polyethylene oligomers raw material of molecular weight 4000, available from Aldrich Chemicals, was melted at about 130° C. and extruded in $10^{-5}$–$10^{-6}$ torr vacuum to be spread on a hot rotating drum at about 300° C. and evaporated. The formed vapor was deposited as a solid coating (0.3 to 0.5 micron thick) on a rotating cold drum (kept at about 0° C.). Aluminum film was deposited in-line on top of the polyethylene film. The drum was rotating at 200 ft/min. A multilayer sequential (about 5000 layers) metal-release coating strap was formed. The metal flakes were then produced by extracting the polyethylene release layer by either melting it (at about 100° C.) or dissolving it (in toluene).

Run 2: Poly(α-methylstyrene) oligomers of molecular weight 1300, available from Aldrich Chemicals, were melted at about 150° C. and extruded in $10^{-5}$–$10^{-6}$ torr vacuum to be spread on a hot rotating drum (kept at about 300° C.) and evaporated. The formed vapor was deposited as a solid coating (0.3 to 0.5 micron thick) on a rotating cold drum (kept at about 0° C.). Aluminum film was deposited in-line on top of the polyethylene film. The drum was rotating at 200 ft/min. A multilayer sequential (about 5000 layers) metal-release coating strap was formed. The metal flakes were then produced by extracting the polyethylene release layer by either melting it (at about 100° C.) or dissolving it (in toluene). Similar products were produced successfully with poly(α-methylstyrene) oligomers of molecular weight up to 2000.

EXAMPLE 3

This example illustrates the manufacture of electrically conductive coatings (existing technology is a solvent-based, slow coating process). Polyaniline oligomers can be prepared according to syntheses techniques that offer absolute control over the molecular weight and the end group of the polymer. These techniques are well known in the art. See, for example, E. Rebourt et al., "Polyanaline Oligomers; Synthesis and Characterization," Synthetic Metals 84 (1997) 65–66; and K. Matyjaszewski et al., "Synthesis of Well-Defined Polyacrylonitrile by Atom Transfer Radical Polymerization," Macromolecules, Vol. 30, No. 20, 1997. The degree of polymerization can thus be optimized to produce conducting oligomers that meet the requirements for vacuum deposition. The same concept can be applied to polypyrrole and polythiophene, leading to high speed, large scale commercial production for a variety of electroactive conducting polymer coatings useful in a multitude of applications (electrostatic dissipation, corrosion resistance, and sensor manufacturing).

Run 1: Polyaniline oligomers, average molecular weight 550–850, were synthesized and melted/extruded at about 150° C. in a $10^{-5}$–$10^{-6}$ torr vacuum for spreading over a hot rotating drum (at about 350° C.) and evaporated according to the invention. The formed vapor, driven by vacuum, was deposited as a solid coating (1.0 to 3.0 micron thick) on a cold polyester web at about 0° C. The web was running at 100 ft/min. The polyaniline film was doped with 0.1 molar hydrochloric acid solution, dried, and characterized for various properties. Similar runs were performed successfully with polyaniline oligomers of molecular weight up to 1000.

Run 2: Polyaniline oligomers, average molecular weight 550–850, were synthesized and mixed with an equivalent amount of tetracyanoethylene as a dopant, then melted/extruded at about 150° C. in a $10^{-5}$–$10^{-6}$ torr vacuum, and spread on a hot rotating drum (at about 350° C.) and evaporated. The formed vapor, driven by vacuum, was deposited as a solid coating (1.0 to 3.0 micron thick) on a cold polyester web at about 0° C. The web was running at 100 ft/min. The doped polyaniline film was characterized for various properties.

EXAMPLE 4

This example illustrates the manufacture of heat-sealable coatings used for lamination and packaging (commercially available technology is solvent-based, or by extrusion at atmospheric conditions). These heat-sealable coatings can be utilized, for example, to laminate polyethylene and polypropylene materials used in automotive interiors, as well as for packaging medical equipment, electrical devices, and food items. Bicycloaliphatic oligomers are suitable for this application. Such oligomers of desirable molecular weight (average 700–1,200) are available commercially; they can also be prepared according to syntheses techniques that are well-known in the art.

Run 1: Bicycloheptadiene oligomer (average molecular weight 800) was melted/extruded at about 150° C. in a $10^{-5}$–$10^{-6}$ torr vacuum for spreading on a hot rotating drum (at about 150° C.) and evaporated according to the invention. The formed vapor, driven by vacuum, was deposited as a solid coating (1.0 to 3.0 micron thick) on a cold continuous web of polyethylene terphthlate (PET) at about 0° C. The web was running at 100 ft/min. Similar runs were performed successfully with woven and nonwoven substrates (with and without metallization) running at speeds of up to 400 ft/min.

The resulting thin films were suitable for forming a sealed component upon heating to about 80–120° C. and pressing against a support structure. It is noted that any polymer with a sufficiently long polymeric chain to flow upon heating and diffuse within the contacted matrix of another structure can be used to produce a heat-sealable coating.

Run 2: The same as run 1, except that Limonene oligomer (average molecular weight 900) was used on a polypropylene web.

Run 3: The same as run 1, except that α-Methylstyrene oligomer (average molecular weight 1,200) was used on a metallized polypropylene web.

EXAMPLE 5 (PROFETIC)

This example illustrates the manufacture of high-barrier coatings for packaging materials (existing technology consists of solvent based coatings). The object is the preparation of a coating with very low permeability to oxygen and vapors.

It is expected that low molecular weight polyacrylonitrile or polyvinylidene chloride (up to 5000 Mw), having the necessary properties for practicing the invention, can be flash evaporated and vacuum deposited on various film substrates to produce barrier coatings for packaging materials.

These examples demonstrate the feasibility of manufacturing thin polymeric coatings by vapor deposition utilizing solid raw material. The resulting process possesses the advantages of being solvent-free, environmentally safe, and high rate. Large areas of coating (up to 1000 ft/min) can be applied at low cost.

The resulting products are in the form of highly uniform, defect-free coatings.

Various changes in the details, steps and components that have been described may be made by those skilled in the art within the principles and scope of the invention herein illustrated and defined in the appended claims. Therefore, while the present invention has been shown and described herein in what is believed to be the most practical and preferred embodiments, it is recognized that departures can be made therefrom within the scope of the invention, which is not to be limited to the details disclosed herein but is to be accorded the full scope of the claims so as to embrace any and all equivalent processes and products.

We claim:

1. A process for forming a solid thin-film layer of oligomeric material in a vapor deposition unit operating at a predetermined pressure, a predetermined evaporator temperature, and a predetermined condenser temperature, the process comprising the following steps:
    (a) polymerizing a monomer to obtain a solid oligomer thereof having a vaporization temperature at said predetermined pressure that does not exceed said predetermined evaporator temperature, and having a decomposition temperature at said predetermined pressure that exceeds said predetermined evaporator temperature;
    (b) flash evaporating the solid oligomer in said vapor deposition unit to produce a vapor at said predetermined pressure and evaporator temperature; and
    (c) cryocondensing the vapor to produce a solid oligomer in thin-film form in the absence of irradiation during the flash evaporating and cryocondensing steps;
    wherein said monomer is a bicycloaliphatic component used to prepare a heat-sealable coating and said oligomer has a molecular weigh not to exceed about 1200.

2. A process for forming a solid thin-film layer of oligomeric material in a vapor deposition unit operating at a predetermined pressure, a predetermined evaporator temperature, and a predetermined condenser temperature, the process comprising the following steps:
    (a) polymerizing a monomer to obtain a solid oligomer thereof having a vaporization temperature at said predetermined pressure that does not exceed said predetermined evaporator temperature, and having a decomposition temperature at said predetermined pressure that exceeds said predetermined evaporator temperature;
    (b) flash evaporating the solid oligomer in said vapor deposition unit to produce a vapor at said predetermined pressure and evaporator temperature; and
    (c) cryocondensing the vapor to produce a solid oligomer in thin-film form in the absence of irradiation during the flash evaporating and cryocondensing steps;
    wherein said cryocondensing step is conducted over a continuous substrate passing through the vapor deposition unit.

3. Apparatus for vaporizing a solid oligomeric material in a vapor deposition unit, comprising the following combination of components:
    a vapor deposition chamber;
    an extruder operable at controlled throughput for delivering a predetermined rate of said oligomeric material at an output of the extruder;
    a heater adapted to melt the solid oligomeric material and produce a melted form thereof prior to passage through said output of the extruder; and
    a nozzle coupled to said output of the extruder and adapted to release a film of said melted form of the oligomeric material into said vapor deposition chamber;
    further comprising a heated rotating drum having a surface adapted to receive said film upon release from the nozzle.

4. The apparatus of claim 3, wherein said heater is operably coupled to the extruder.

5. The apparatus of claim 3, wherein said nozzle includes a slit of a predetermined width defining a thickness for said film.

6. The apparatus of claim 5, wherein said predetermined width is less than about 2 mm.

* * * * *